(12) United States Patent
Tsukada

(10) Patent No.: US 6,174,789 B1
(45) Date of Patent: Jan. 16, 2001

(54) METHOD OF DIVIDING A COMPOUND SEMICONDUCTOR WAFER INTO PELLETS BY UTILIZING EXTREMELY NARROW SCRIBE REGIONS

(75) Inventor: Yasutoshi Tsukada, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/250,164

(22) Filed: Feb. 16, 1999

(30) Foreign Application Priority Data

Feb. 20, 1998 (JP) ................................................. 10-038863

(51) Int. Cl.[7] ........................... H01L 21/46; H01L 21/78; H01L 21/301
(52) U.S. Cl. ........................... 438/462; 438/460; 438/465
(58) Field of Search .................................... 438/460, 462, 438/465

(56) References Cited

U.S. PATENT DOCUMENTS

| | | | | |
|---|---|---|---|---|
| 3,794,883 | * | 2/1974 | Bylander | 317/234 |
| 4,237,601 | * | 12/1980 | Woolhouse | 29/583 |
| 5,126,286 | * | 6/1992 | Chance | 437/203 |
| 5,196,378 | * | 3/1993 | Bean | 437/226 |

* cited by examiner

Primary Examiner—Charles Bowers
Assistant Examiner—Nema Berezny
(74) Attorney, Agent, or Firm—Young & Thompson

(57) ABSTRACT

The second present invention provides a method of dividing a semiconductor wafer with an orientation flat into a plurality of pellets defined by both first scribe regions which extend in parallel to each other over the semiconductor wafer in a first direction parallel to the orientation flat and second scribe regions which extend in parallel to each other over the semiconductor wafer in a second direction perpendicular to the first direction. The method comprises the following steps. A metal film is selectively provided, which covers at least the first and second scribe regions. The metal film is selectively etched along longitudinal center lines of the first and second scribe regions by a lithography using a resist, so as to form metal masks, each of which comprises a pair of slender stripe masks separated from each other by a gap which extends on the longitudinal center line, so that longitudinal center parts of the first and second scribe regions are shown through the gaps of the metal masks. An anisotropic etching to the longitudinal center parts of the first and second scribe regions is carried out by use of the metal masks to form trench grooves extending along the longitudinal center lines of the first and second scribe regions. The semiconductor wafer with the metal mask is cleaved along the trench grooves to pelletize the semiconductor wafer into a plurality of pellets.

25 Claims, 7 Drawing Sheets

Orientation Flat

Dicing Method

Point-Scribe Method

Orientation Flat

METHOD OF DIVIDING A COMPOUND SEMICONDUCTOR WAFER INTO PELLETS BY UTILIZING EXTREMELY NARROW SCRIBE REGIONS

BACKGROUND OF THE INVENTION

The present invention relates to a method of pelletizing a compound semiconductor wafer into pellets, and more particularly to a method of dividing a compound semiconductor wafer into pellets by utilizing extremely narrow scribe regions.

FIG. 1 is a plan view illustrative of a compound semiconductor wafer with an orientation flat, wherein scribe lines have been drawn on a surface of the compound semiconductor wafer. The descriptions will be made of the conventional method of dividing the compound semiconductor wafer 1 into a plurality of square-shaped pellets 2 defined by both first scribe regions 3 which extend in parallel to each other over the compound semiconductor wafer 1 in a first direction or horizontal direction parallel to the orientation flat, and second scribe regions 3 which extend in parallel to each other over the semiconductor wafer 1 in a second direction perpendicular to the first direction. FIG. 2 is a fragmentary enlarged plan view illustrative of scribe regions and pellet regions in a compound semiconductor wafer. FIG. 3 is a view illustrative of a dicing method as a conventional method of dividing a semiconductor wafer into pellets, wherein the scratches are drawn by a grinding machine along the scribe regions of the wafer. FIG. 4 is a view illustrative of a point-scribe method as a conventional method of dividing a semiconductor wafer into pellets, wherein a needle is used to draw the scratches along the scribe regions of the wafer.

The above described conventional dicing and point-scribe methods are to draw the scratches by mechanical tools such as a grinder and needle, for which reason surfaces of the scratches are made rough by mechanical shock applied by the mechanical tools such as a grinder and needle. This roughness of the surfaces of the scratches may cause the appearance of cracks and breaking of the pellet regions during the process for cleaving the wafer along the scratches to divide the wafer into the pellets. Once any crack or break appears on the pellets, then those pellets are no longer available as semiconductor chips, whereby the yield is lowered.

The above conventional dicing method and the point-scribe method are engaged with difficulty to further improve the accuracy in position of the grinder or the needle, for which reason it is difficult to further reduce a width of the scribe region in consideration of the necessary margin. This provides a limitation to further improve the required yield.

In the above circumstances, it had been required to develop a novel method of dividing a wafer into pellets with allowing reduction in the necessary width of the scribe region for reducing the total area of the scribe region to improve the yield without, however, causing crack or break of the pellets upon the cleaving process.

SUMMARY OF THE INVENTION

Accordingly, it is an object of the present invention to provide a novel method of dividing a wafer into pellets free from the above problems.

It is a further object of the present invention to provide a novel method of dividing a wafer into pellets by allowing reduction in the necessary width of the scribe region for reducing the total area of the scribe region to improve the yield without, however, causing crack or break of the pellets upon the cleaving process.

The present invention provides a method of dividing a semiconductor wafer with an orientation flat into a plurality of pellets defined by both first scribe regions which extend in parallel to each other over the semiconductor wafer in a first direction parallel to the orientation flat and second scribe regions which extend in parallel to each other over the semiconductor wafer in a second direction perpendicular to the first direction. The method comprises the following steps. A metal film is selectively provided, which covers at least the first and second scribe regions. The metal film is selectively etched along longitudinal center lines of the first and second scribe regions by a lithographic process using a resist, so as to form metal masks, each of which comprises a pair of slender stripe masks separated from each other by a gap which extends on the longitudinal center line, so that longitudinal center parts of the first and second scribe regions are shown through the gaps of the metal masks. An anisotropic etching of the longitudinal center parts of the first and second scribe regions is carried out by use of the metal masks to form trench grooves extending along the longitudinal center lines of the first and second scribe regions. The semiconductor wafer with the metal mask is cleaved along the trench grooves to pelletize the semiconductor wafer into a plurality of pellets.

The above and other objects, features and advantages of the present invention will be apparent from the following techniques.

BRIEF DESCRIPTION OF THE DRAWINGS

Preferred embodiments according to the present invention will be described in detail with reference to the accompanying drawings.

DISCLOSURE OF THE INVENTION

Figure 1:
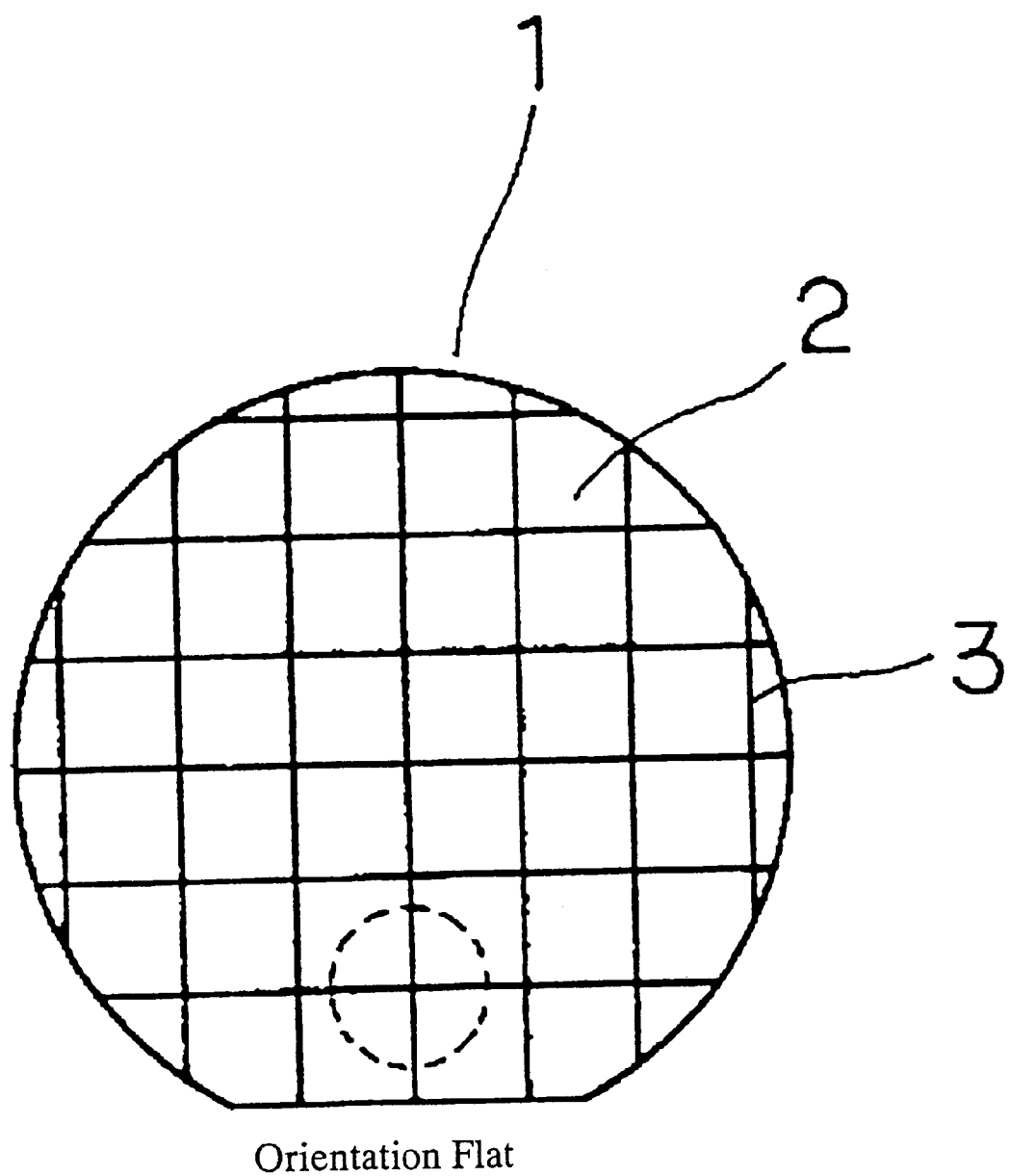
FIG. 1 is a plan view illustrative of a compound semiconductor wafer with an orientation flat, wherein scribe lines have been drawn on a surface of the compound semiconductor wafer.
Figure 2:
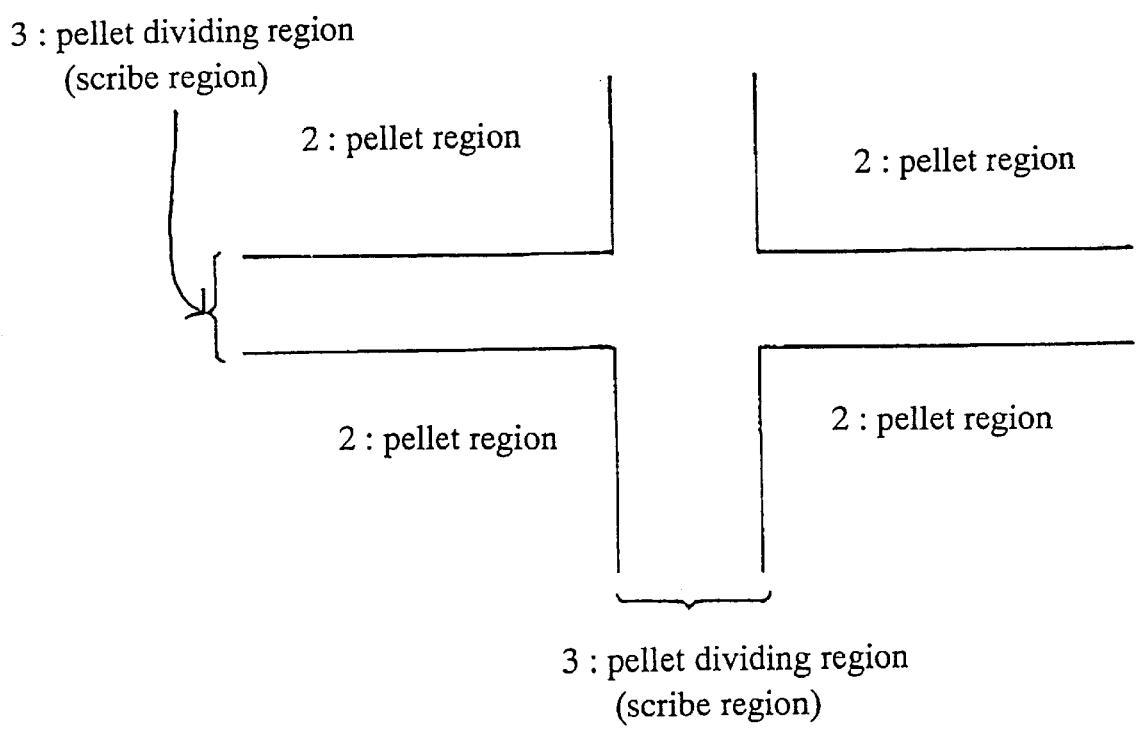
FIG. 2 is a fragmentary enlarged plan view illustrative of scribe regions and pellet regions in a compound semiconductor wafer.

The first aspect of the invention provides a method of dividing a semiconductor wafer into a plurality of pellets The method comprises the following steps. At least a metal mask is selectively provided over at least a part of a pellet-dividing region of a semiconductor wafer, wherein the at least metal mask has a gap extending in a longitudinal direction of the pellet-dividing region, so that a longitudinally extending part of the pellet-dividing region is shown through the gap of the at least metal mask. An anisotropic etching to the longitudinally extending part of the pellet-dividing region is carried out by use of the metal mask to form at least a groove in the pellet-dividing region. The semiconductor wafer with the at least metal mask is cleaved along the at least groove so as to divide the semiconductor wafer into a plurality of pellets.

The above anisotropic etching by use of the metal mask may be carried out by a dry etching process using the metal mask thereby allowing a width of the groove to be much narrower than either a width of a scratch formed by a needle in accordance with a point scribe method or a width of a scratch formed by a grinding blade in accordance with a dicing method. The extremely fine and narrow groove allows narrowing the width of the pellet-dividing region, thereby reducing an area of the pellet-dividing region in the semiconductor wafer. This reduction in the area of the pellet-dividing region in the semiconductor wafer causes an increase in an area of pellet regions defined by the pellet-dividing region. This reduction in the area of the pellet-dividing region and the increase in the area of pellet regions result in increase in the yield of the pellets per a single wafer. This further allows a reduction in manufacturing cost for semiconductor devices formed in the pellets.

For example, the dry etching process using the resist may form an extremely fine and narrow groove having a width in the range of 30–100 micrometers. The groove may have a sectioned shape of trench. Further, a depth of the groove may be decided in consideration of a thickness and material of the wafer. For example, the groove may have a depth in the range of 30–150 micrometers when the semiconductor wafer comprises a GaAs wafer having a thickness of 600 micrometers.

The above metal mask remains on the first and second pellet-dividing regions until the wafer is cleaved by application of pressure to the wafer, so that the metal mask is capable of preventing the wafer from cracking and breaking during application of the pressure to the wafer to cause the wafer to be cleaved, for which reason the above present invention is more effective with a low hardness or fragile semiconductor wafer.

It is preferable that the at least metal mask comprises a pair of slender stripe masks separated from each other by the gap which extends on a longitudinal center line of the pellet-dividing region.

It is also preferable that the at least metal mask is selectively provided by the following steps of: selectively forming a metal film which covers at least the pellet-dividing region; and carrying out a lithographic process by use of a resist to selectively etch the metal film thereby forming the at least metal mask having the gap. This lithography may be a photo-lithography using an ultraviolet ray and a photo-resist. This lithography may also be an X-ray lithography using an X-ray and an X-ray resist. This lithography may also be an electron beam lithography using an electron beam and an electron beam resist.

It is further preferable that the metal film is formed, which covers not only the pellet-dividing region but, also at least a pellet region before the metal film is selectively etched to form not only the at least metal mask over the pellet-dividing region but also at least a metal layer having a predetermined pattern for a device over the at least pellet region.

It is also preferable that the semiconductor wafer be cleaved by the steps of: adhering at least one face of the semiconductor wafer onto at least an adhesive tape; and applying a pressure onto the adhesive tape to apply a force to the semiconductor wafer to cause cleaving the semiconductor wafer along the at least groove.

It is further more preferable that the pressure is selectively applied to be concentrated onto the pellet-driving region. This selective application of the pressure concentrated onto the first and second scribe regions prevents the wafer from cracking and breaking. This prevention of cracking and breaking of the semiconductor wafer results in an increase in the yield of the pellets, thereby allowing a reduction in manufacturing cost for semiconductor devices formed in the pellets.

It is moreover preferable that the pressure is applied by pressing a cylindrically shaped roller to the semiconductor wafer and rolling the cylindrically shaped roller along the longitudinal direction of the pellet-dividing region, thereby preventing the wafer from cracking and breaking.

It is also preferable that the pellet-dividing region comprises first pellet-dividing regions which extend in parallel to each other over the semiconductor wafer in a first direction parallel to an orientation flat of the semiconductor wafer and second pellet-dividing regions which extend in parallel to each other over the semiconductor wafer in a second direction perpendicular to the first direction.

It is also preferable that the metal mask comprises laminations of Ti/Al layers. The metal mask may comprise the same material as the metal layers such as interconnection layers on the pellet regions, so that the metal masks and the interconnections may be concurrently formed in the same process.

It is also preferable that the semiconductor wafer be a compound semiconductor wafer having a lower hardness than a silicon semiconductor wafer, for example, GaAs, GaP, GaAsP, and InP wafers. The above present invention is capable of preventing the wafer from cracking and breaking during application of the pressure to the wafer to cause the wafer to be cleaved, for which reason the above present invention is more effective with a low hardness or fragile semiconductor wafer.

As a modification to the above first aspect of the invention, the mask may be made of other materials than the metals, provided that the materials of the mask are harder than the wafer. In addition, the above mask may be made of a metal which has a lower etching rate than a material of the wafer in the anisotropic etching process so that a part of the pellet-dividing region under the gap of the mask may selectively be etched. For example, various metals are available for the mask because most of the metals have greater hardness than the semiconductor wafer and have a lower etching rate than the semiconductor wafer. Particularly, if the wafer comprises a compound semiconductor such as GaAs having a low hardness, then many materials are available for the mask. Even if the wafer comprises either a silicon wafer or a ceramic wafer having greater hardness than the compound semiconductor wafer, then the mask is useable by selecting the material having greater hardness than silicon and ceramic. For those reasons, the available materials for the mask are not only metals but also other materials having a hardness greater than the material of the wafer so that the mask has a lower etching rate than the wafer during anisotropic etching such as a dry etching process.

The above first aspect of the invention is applicable to not only various compound semiconductor wafers but also a silicon wafer, provided that it is necessary to form the groove more deeply to allow cleaving of the silicon wafer.

The above first aspect of the invention is also applicable to not only various compound semiconductor wafers but also a silicon wafer and a ceramic wafer, provided that it is necessary to form the groove more deeply to allow cleaving of the ceramic wafer.

The second aspect of the invention provides a method of dividing a semiconductor wafer with an orientation flat into a plurality of pellets defined by both first scribe regions which extend in parallel to each other over the semiconductor wafer in a first direction parallel to the orientation flat and second scribe regions which extend in parallel to each other over the semiconductor wafer in a second direction perpendicular to the first direction. The method comprises the following steps. A metal film is selectively provided, which covers at least the first and second scribe regions. The metal film is selectively etched along longitudinal center lines of the first and second scribe regions by a lithographic process using a resist, so as to form metal masks, each of which comprises a pair of slender stripe masks separated from each other by a gap which extends on the longitudinal center line, so that longitudinal center parts of the first and second scribe regions are shown through the gaps of the metal masks. An anisotropic etching of the longitudinal center parts of the first and second scribe regions is carried out by use of the metal masks to form trench grooves extending along the longitudinal center lines of the first and second scribe regions. The semiconductor wafer with the metal mask is cleaved along the trench grooves to pelletize the semiconductor wafer into a plurality of pellets.

The above anisotropic etching by use of the metal mask may be carried out by a dry etching process using the metal mask, thereby allowing a width of the groove to be much narrower than either a width of a scratch formed by a needle in accordance with a point scribe method, or a width of a scratch formed by a grinding blade in accordance with a dicing method. The extremely fine and narrow groove allows narrowing the width of the first and second scribe regions, thereby reducing a total area of the first and second scribe regions in the semiconductor wafer. This reduction in the area of the first and second scribe regions in the semiconductor wafer causes an increase in an area of pellet regions defined by the first and second scribe regions. This reduction in the area of the first and second scribe regions and the increase in the area of pellet regions result in increase in the yield of the pellets per a single wafer. This further allows a reduction in manufacturing cost for semiconductor devices formed in the pellets.

For example, the dry etching process using the resist may form an extremely fine and narrow groove having a width in the range of 30–100 micrometers. The groove may have a sectioned shape of trench. Further, a depth of the groove may be decided in consideration of a thickness and material of the wafer. For example, the groove may have a depth in the range of 30–150 micrometers when the semiconductor wafer comprises a GaAs wafer having a thickness of 600 micrometers.

The above metal mask remains on the first and second scribe regions until the wafer is cleaved by application of the pressure to the wafer, so that the metal mask is capable of preventing the wafer from cracking and breaking during application of the pressure to the wafer to cause the wafer to be cleaved, for which reason the above present invention is more effective with a low hardness or fragile semiconductor wafer.

The above lithography may be a photo-lithography using an ultraviolet ray and a photo-resist. The above lithography may also be an X-ray lithography using an X-ray and an X-ray resist. The above lithography may also be an electron beam lithography using an electron beam and an electron beam resist.

It is preferable that the semiconductor wafer be cleaved by the steps of: adhering at least an opposite face of the semiconductor wafer to another face, on which the metal mask extends, onto at least an adhesive tape; and applying a pressure onto the adhesive tape to apply a force to the semiconductor wafer to cause cleaving the semiconductor wafer along the trench grooves.

It is further preferable that the pressure be selectively applied and concentrated onto the first and second scribe regions. This selective application of the pressure concentrated onto the first and second scribe regions prevents the wafer from cracking and breaking. This prevention of cracking and breaking of the semiconductor wafer results in an increase in the yield of the pellets, thereby allowing a reduction in manufacturing cost for semiconductor devices formed in the pellets.

It is further more preferable that the pressure be applied by pressing a cylindrically shaped roller to the semiconductor wafer and rolling the cylindrically shaped roller along the first and second directions, thereby preventing the wafer from cracking and breaking. This prevention of cracking and breaking of the semiconductor wafer results in an increase in the yield of the pellets, thereby allowing a reduction in manufacturing cost for semiconductor devices formed in the pellets.

It is also preferable that the metal film comprises laminations of Ti/Al layers. The metal mask may comprise the same material as the metal layers such as interconnection layers on the pellet regions, so that the metal masks and interconnections maybe concurrently formed in the same process.

It is also preferable that the semiconductor wafer be a compound semiconductor wafer having a lower hardness than a silicon semiconductor wafer, for example, GaAs, GaP, GaAsP, and InP wafers. The above present invention is capable of preventing the wafer from cracking and breaking during application of the pressure to the wafer to cause the wafer to be cleaved, for which reason the above present invention is more effective with a low hardness or fragile semiconductor wafer.

It is preferable that the metal film is formed, which covers not only the first and second scribe regions but also at least a pellet region, before the metal film is selectively etched to form not only the metal mask over the first and second scribe regions but also a metal layer having a predetermined pattern for a device over the pellet region.

As a modification to the above second aspect of the invention, the mask may be made of other materials than the metals, provided that the materials of the mask are harder than the wafer. The above mask may be made of a metal which has lower etching rate than a material of the wafer during anisotropic etching process so that a part of the pellet-dividing region under the gap of the mask may selectively be etched. For example, various metals are available for the mask because most of the metals have greater hardness than the semiconductor wafer and have a lower etching rate than the semiconductor wafer. Particularly, if the wafer comprises a compound semiconductor such as GaAs having a low hardness, then many materials are available for the mask. Even if the wafer comprises either a silicon wafer or a ceramic wafer having greater hardness than the compound semiconductor wafer, then the mask is useable by selecting the material having the greater hardness than silicon and ceramic. For those reasons, the available materials for the mask are not only metals but also other materials harder than the material of the wafer so that the mask has a lower etching rate than the wafer during anisotropic etching such as the dry etching process.

The above second aspect of the invention is applicable to not only various compound semiconductor wafers but also a silicon wafer, provided that it is necessary to form the groove more deeply to allow cleaving of the silicon wafer.

The above second aspect of the invention is also applicable to not only various compound semiconductor wafers, but also a silicon wafer and a ceramic wafer, provided that it is necessary to form the groove more deeply to allow cleaving of the ceramic wafer.

The third aspect of the invention provides a method of forming at least a groove on a wafer for allowing the wafer to be cleaved along the groove for dividing the wafer into a plurality of pellets. The method comprises the step of carrying out an anisotropic etching by use of a mask covering a part of a pellet-dividing region of the wafer, wherein the mask has a gap extending in a longitudinal direction of the pellet-dividing region, so as to selectively etch a longitudinally extending part of the pellet-dividing region shown through the gap of the mask, thereby to form at least a groove in the pellet-dividing region.

It is preferable that the mask be made of a metal.

The above anisotropic etching by use of the mask may be carried out by a dry etching process using the mask thereby allowing a width of the groove to be much narrower than either a width of a scratch formed by a needle in accordance with a point scribe method or a width of a scratch formed by a grinding blade in accordance with a dicing method. The extremely fine and narrow groove allows narrowing the width of the pellet-dividing region, thereby reducing an area of the pellet-dividing region in the wafer. This reduction in the area of the pellet-dividing region in the wafer causes an increase in an area of pellet regions defined by the pellet-dividing region. This reduction in the area of the pellet-dividing region and the increase in the area of pellet regions result in an increase in the yield of the pellets per a single wafer. This further allows a reduction in manufacturing costs for semiconductor devices formed in the pellets.

For example, the dry etching process using the resist may form an extremely fine and narrow groove having a width in the range of 30–100 micrometers. The groove may have a sectioned shape of trench. Further, a depth of the groove may be decided in consideration of a thickness and material of the wafer. For example, the groove may have a depth in the range of 30–150 micrometers when the wafer comprises a GaAs wafer having a thickness of 600 micrometers.

The above mask remains on the first and second pellet-dividing regions until the wafer is cleaved by application of the pressure to the wafer, so that the mask is capable of preventing the wafer from cracking and breaking during application of the pressure to the wafer to cause the wafer to be cleaved, for which reason the above present invention is more effective with a low hardness or fragile wafer.

The above mask may be made of a metal which has a lower etching rate than a material of the wafer in the anisotropic etching process so that a part of the pellet-dividing region under the gap of the mask may selectively be etched. For example, various metals are available for the mask because most of the metals have greater hardness than the semiconductor wafer and have a lower etching rate than the semiconductor wafer. Particularly, if the wafer comprises a compound semiconductor such as GaAs having a low hardness, then many materials are available for the mask. Even if the wafer comprises either a silicon wafer or a ceramic wafer having larger hardness than the compound semiconductor wafer, then the mask is useable by selecting the material having the greater hardness than silicon and ceramic. For those reasons the available materials for the mask are not only metals but also other materials harder than the material of the wafer so that the mask has a lower etching rate than the wafer in the anisotropic etching such as the dry etching process.

It is preferable that the at least mask comprises a pair of slender stripe masks separated from each other by the gap which extends on a longitudinal center line of the pellet-dividing region.

It is also preferable that the mask have a pair of slender stripe metal masks separated from each other by the gap which extends on a longitudinal center line of the pellet-dividing region.

It is also preferable that the pellet-dividing region comprises first pellet-dividing regions which extend in parallel to each other over the semiconductor wafer in a first direction parallel to an orientation flat of the semiconductor wafer, and second pellet-dividing regions which extend in parallel to each other over the semiconductor wafer in a second direction perpendicular to the first direction.

It is also preferable that the mask comprises laminations of Ti/Al layers. This metal mask remains on the first and second pellet-dividing regions until the wafer is cleaved by application of the pressure to the wafer, so that the metal mask is capable of preventing the wafer from cracking and breaking during application of the pressure to the wafer to cause the wafer to be cleaved, for which reason the above present invention is more effective with a low hardness or fragile semiconductor wafer.

It is also preferable that the semiconductor wafer be a compound semiconductor wafer having a lower hardness than a silicon semiconductor wafer, for example, GaAs, GaP, GaAsP, and InP wafers. The above present invention is capable of preventing the wafer from cracking and breaking during application of the pressure to the wafer to cause the wafer to be cleaved, for which reason the above embodiment is more effective with a low hardness or fragile semiconductor wafer.

The above third aspect of the invention is applicable to not only various compound semiconductor wafers but also a silicon wafer, provided that it is necessary to form the groove more deeply to allow cleaving of the silicon wafer.

The above third aspect of the invention is also applicable to not only various compound semiconductor wafers but also a silicon wafer and a ceramic wafer, provided that it is necessary to form the groove more deeply to allow the cleave of the ceramic wafer.

DESCRIPTION OF THE PREFERRED EMBODIMENTS

Figure 5:
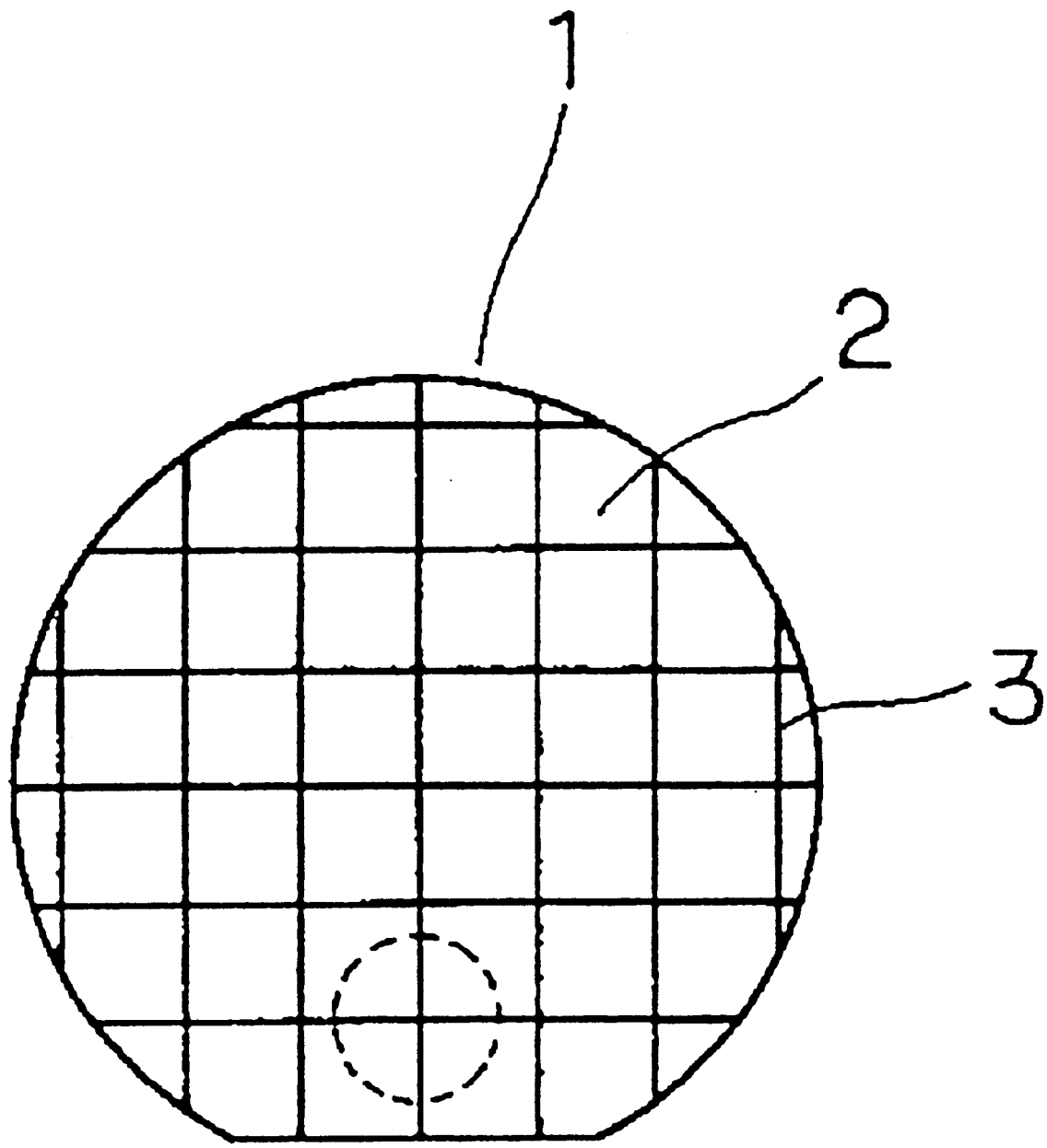
FIG. 5 is a plan view illustrative of a compound semiconductor wafer with an orientation flat, wherein scribe lines have been drawn on a surface of the compound semiconductor wafer.
Figure 6:
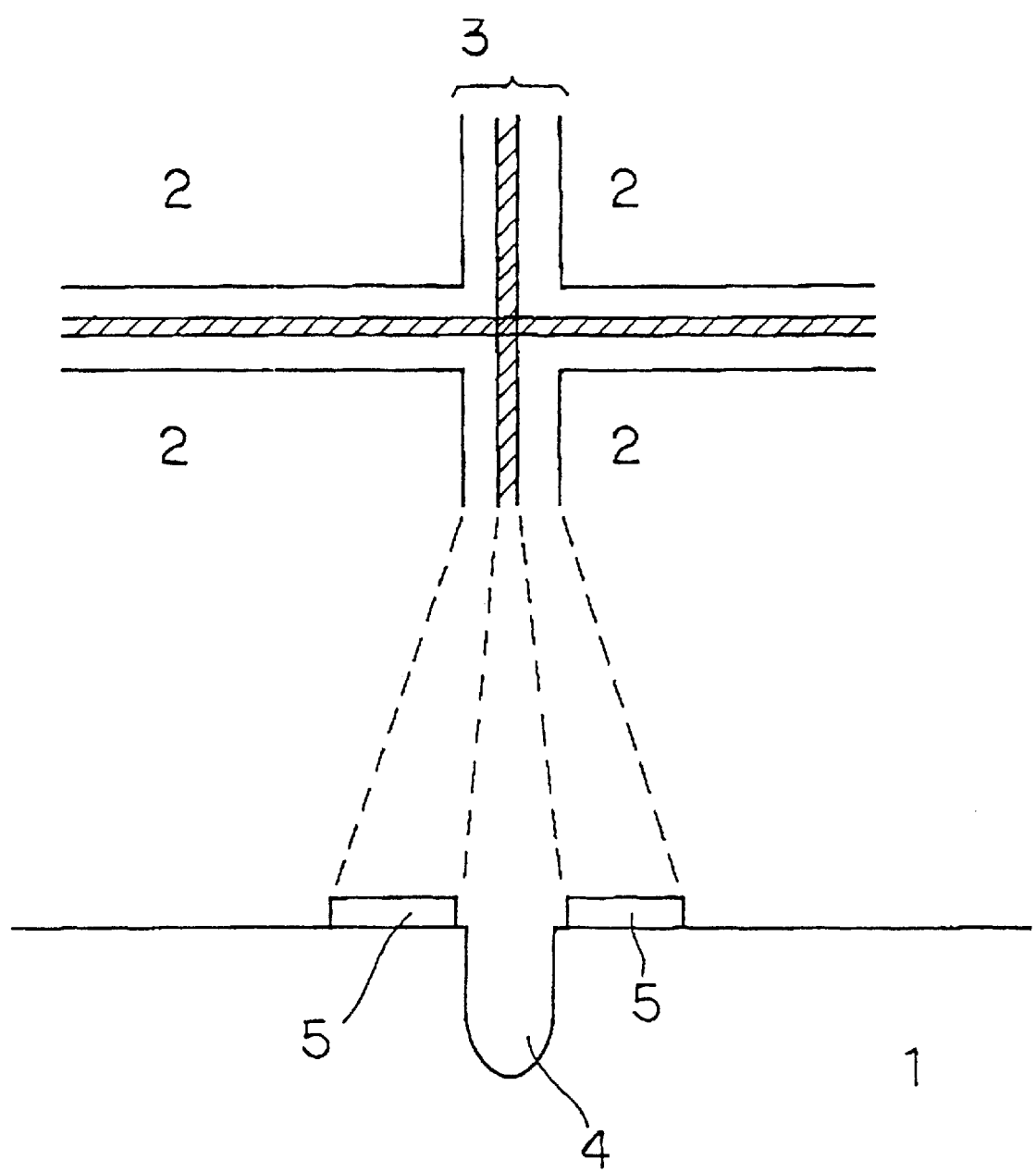
FIG. 6 is a view illustrative of a novel method of dividing a compound semiconductor into pellets, wherein trench grooves are formed in scribe regions for allowing the wafer to be cleaved in accordance with the present invention.
Figure 7:
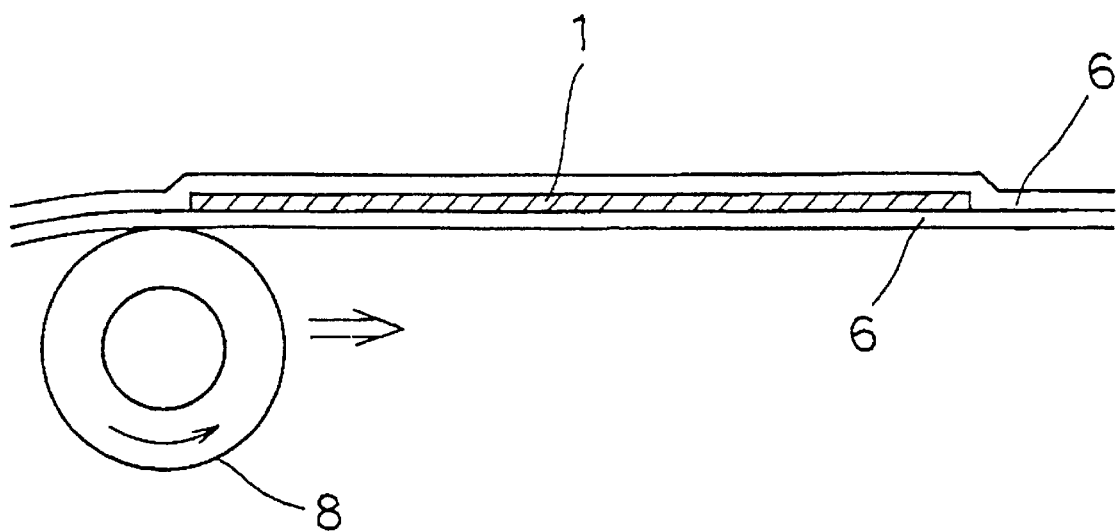
FIG. 7 is a view illustrative of a method of cleaving the wafer along the trench groove to divide the wafer into the pellets in accordance with the present invention.

A first embodiment according to the present invention will be described in detail with reference to FIGS. 5, 6 and 7. FIG. 5 is a plan view illustrative of a compound semiconductor wafer with an orientation flat, wherein scribe lines have been drawn on a surface of the compound semiconductor wafer 1. FIG. 6 is a view illustrative of a novel method of dividing a compound semiconductor into pellets, wherein trench grooves are formed in scribe regions for allowing the wafer to be cleaved in accordance with the present invention. FIG. 7 is a view illustrative of a method of cleaving the wafer along the trench groove to divide the wafer into the pellets in accordance with the present invention. The first embodiment provides a novel method of dividing the compound semiconductor wafer 1 into a plurality of square-shaped pellets 2 defined by both first scribe regions 3 which extend in parallel to each other over the compound semiconductor wafer 1 in a first direction or horizontal direction parallel to the orientation flat and second scribe regions 3 which extend in parallel to each other over the semiconductor wafer 1 in a second direction perpendicular to the first direction. The novel method comprises the following steps.

A metal film 5 is selectively provided, which covers at least the first and second scribe regions 3. The metal film 5 comprises laminations of Ti/Al layers. The metal film 5 may comprise the same material as the metal layers such as interconnection layers on the pellet regions 2, so that the metal films and the interconnections may be concurrently formed in the same process. The metal film 5 is selectively etched along longitudinal center lines of the first and second scribe regions 3 by photo-lithography using a photo-resist, so as to form metal masks 5, each of which comprises a pair of slender stripe masks separated from each other by a gap which is represented by a cross-hatched region and extends on the longitudinal center line, so that cross-hatched longitudinal center parts of the first and second scribe regions 3 are shown through the gaps of the metal masks 5 in FIG. 6. A dry etching of the longitudinal center parts of the first and second scribe regions 3 is carried out by use of the metal masks 5 to form trench grooves 4 extending along the longitudinal center lines of the first and second scribe regions 3. For example, the dry etching process using the resist may form an extremely fine and narrow groove 4 having a width in the range of 30–100 micrometers. The groove 4 may have a sectioned shape of trench. Further, a depth of the trench groove 4 may be decided in consideration of a thickness and material of the compound semiconductor wafer 1. For example, the trench groove 4 may have a depth in the range of 30–150 micrometers when the compound semiconductor wafer 1 comprises a GaAs wafer having a thickness of 600 micrometers.

Opposite faces of the compound semiconductor wafer 1 are adhered onto adhesive tapes 6 as shown in FIG. 7. A pressure is applied onto the adhesive tape 6 to apply a force to the compound semiconductor wafer 1 to cause cleaving the compound semiconductor wafer 1 along the trench grooves 4, so that the compound semiconductor wafer 1 with the metal mask 5 is cleaved along the trench grooves 4 to pelletize the compound semiconductor wafer 1 into a plurality of pellets 2. The above pressure is selectively applied to be concentrated onto the first and second scribe regions 3. This selective application of the pressure concentrated onto the first and second scribe regions 3 prevents the compound semiconductor wafer 1 from cracking and breaking. This prevention of cracking and breaking of the compound semiconductor wafer 1 results in an increase in the yield of the pellets 2, thereby allowing a reduction in manufacturing cost for semiconductor devices formed in the pellets 2. For example, as illustrated in FIG. 7, the pressure is applied by pressing a cylindrically shaped roller 8 to the compound semiconductor wafer 1 and rolling the cylindrically shaped roller 8 along the first and second directions 3, thereby preventing the compound semiconductor wafer 1 from cracking and breaking. This prevention of cracking and breaking of the compound semiconductor wafer 1 results in an increase in the yield of the pellets 2, thereby allowing a reduction in manufacturing cost for semiconductor devices formed in the pellets 2. Further, the metal film 5 is formed, which covers not only the first and second scribe regions 3, but also pellet regions 2 before the metal film 5 is selectively etched to form not only the metal masks 5 over the first and second scribe regions 3 but also metal layers having predetermined patterns for devices over the pellet regions.

Figure 3:
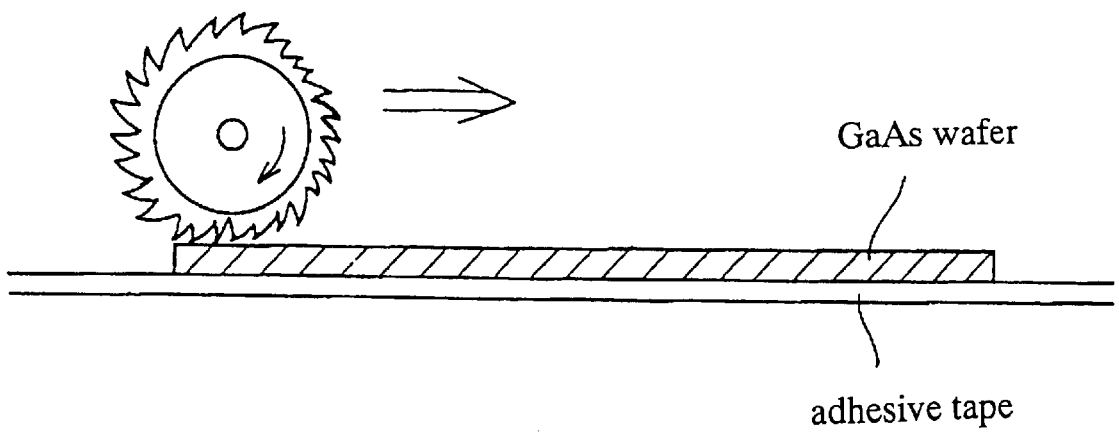
FIG. 3 is a view illustrative of a dicing method as a conventional method of dividing a semiconductor wafer into pellets.
Figure 4:
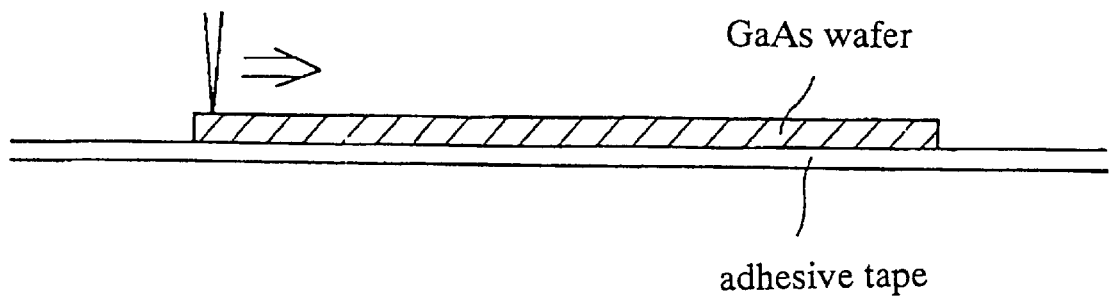
FIG. 4 is a view illustrative of a point-scribe method as a conventional method of dividing a semiconductor wafer into pellets.

The above dry etching process using the metal mask allows a width of the groove to be much narrower than either a width of a scratch formed by a needle in accordance with a point scribe method illustrated in FIG. 4, or a width of a scratch formed by a grinding blade in accordance with a dicing method illustrated in FIG. 3. The extremely fine and narrow groove allows narrowing the width of the first and second scribe regions 3, thereby reducing a total area of the first and second scribe regions 3 in the compound semiconductor wafer 1. This reduction in the area of the first and second scribe regions 3 in the compound semiconductor wafer 1 causes an increase in a total area of the pellet regions 2 defined by the first and second scribe regions 3. This reduction in the area of the first and second scribe regions 3 and the increase in the area of pellet regions 2 result in increase in the yield of the pellets per a single wafer. This further allows a reduction in manufacturing cost for semiconductor devices formed in the pellets.

The above metal masks 5 remain on the first and second scribe regions 3 until the compound semiconductor wafer 1 is cleaved by application of the pressure to the compound semiconductor wafer 1, so that the metal masks 5 are capable of preventing the compound semiconductor wafer 1 from cracking and breaking during application of the pressure to the compound semiconductor wafer 1 which causes the compound semiconductor wafer 1 to be cleaved, for which reason the above present invention is more effective with low hardness or fragile compound semiconductor wafers. Namely, the compound semiconductor wafer 1, for example, GaAs, GaP, GaAsP, and InP wafers has a lower hardness than a silicon semiconductor wafer. The above present invention is capable of preventing the silicon semiconductor wafer 1 from cracking and breaking during application of the pressure to the wafer which causes the compound semiconductor wafer 1 to be cleaved, for which reason the above present invention is more effective with a low hardness or fragile compound semiconductor wafer 1.

As a modification to the above photo-lithography using an ultraviolet ray and a photo-resist, the above lithography may also be an X-ray lithography using an X-ray and an X-ray resist. The above lithography may also be an electron beam lithography using an electron beam and an electron beam resist.

As a further modification, the mask 5 may be made of other materials than metals, provided that the materials of the mask 5 are harder than the compound semiconductor wafer 1. In addition, the above mask 5 may be made of a metal which has a lower etching rate than a material of the compound semiconductor wafer 1 in the dry etching process so that a part of the first and second scribe regions 3 under the cross-hatched gaps of the masks 5 may selectively be etched. For example, various metals are available for the masks 5 because most of the metals have greater hardness than the semiconductor wafer 1, and have a lower etching rate than the semiconductor wafer 1. Particularly, if the wafer comprises a compound semiconductor such as GaAs having a low hardness, then many materials are available for the mask 5. Even if the wafer 1 comprises either a silicon wafer or a ceramic wafer having greater hardness than the compound semiconductor wafer 1, then the mask 1 is useable by selecting the material having the greater hardness than silicon and ceramic. For those reasons, the available materials for the mask 1 are not only metals, but also other materials having a hardness greater than the material of the wafer 1 so that the mask has a lower etching rate than the wafer in the dry etching process.

The above novel method is applicable to not only various compound semiconductor wafers, but also a silicon wafer where it is necessary to form the groove more deeply to allow the cleave of the silicon wafer. The above novel method is also applicable to not only various compound semiconductor wafers, but also a silicon wafer and a ceramic wafer where it is also necessary to form the groove more deeply to allow the cleave of the ceramic wafer.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

what is claimed is:

1. A method of dividing a semiconductor wafer into a plurality of pellets, said method comprising the steps of:
   selectively providing a mask over at least a part of a pellet-dividing region of the semiconductor wafer, wherein said mask has a gap extending in a longitudinal direction of said pellet-dividing region, so that a longitudinally extending part of said pellet-dividing region is shown through said gap of said mask, wherein said mask has a hardness greater than a hardness of said semiconductor wafer;
   carrying out an anisotropic etching of said longitudinally extending part of said pellet-dividing region by use of said mask to form a groove in said pellet-dividing region having a depth greater than a width of said groove; and
   cleaving said semiconductor wafer along said groove so as to divide said semiconductor wafer into a plurality of pellets.

2. The method as claimed in claim 1, wherein said mask comprises a pair of slender stripe masks separated from each other by said gap which extends on a longitudinal center line of said pellet-dividing region.

3. The method as claimed in claim 1, wherein said mask is selectively provided by the following steps of:
   selectively forming a film which covers at least said pellet-dividing region; and
   carrying out a lithographic process by use of a resist to selectively etch said film thereby forming said mask having said gap.

4. The method as claimed in claim 3, wherein said film is a metal film formed to cover said pellet-dividing region and a pellet region before said metal film is selectively etched to form not only said mask over said pellet-dividing region, but also a metal pattern for a device over said pellet region.

5. The method as claimed in claim 1, wherein said semiconductor wafer is cleaved by the steps of:
   adhering at least one face of said semiconductor wafer onto at least an adhesive tape; and
   applying a pressure onto said adhesive tape to apply a force to said semiconductor wafer to cause cleaving said semiconductor wafer along said groove.

6. The method as claimed in claim 5, wherein said pressure is selectively applied to be concentrated onto said pellet-dividing region.

7. The method as claimed in claim 6, wherein said pressure is applied by pressing a cylindrically shaped roller to said semiconductor wafer and rolling said cylindrically shaped roller along said longitudinal direction of said pellet-dividing region.

8. The method as claimed in claim 1, wherein said pellet-dividing region comprises first pellet-dividing regions which extend in parallel to each other over said semiconductor wafer in a first direction parallel to an orientation flat of said semiconductor wafer and second pellet-dividing regions which extend in parallel to each other over said semiconductor wafer in a second direction perpendicular to said first direction.

9. The method as claimed in claim 1, wherein said mask comprises laminations of Ti/Al layers.

10. The method as claimed in claim 1, wherein said semiconductor wafer is a compound semiconductor wafer having a lower hardness than a silicon semiconductor wafer.

11. A method of dividing a semiconductor wafer with an orientation flat into a plurality of pellets defined by both first scribe regions which extend in parallel to each other over said semiconductor wafer in a first direction parallel to said orientation flat and second scribe regions which extend in parallel to each other over said semiconductor wafer in a second direction perpendicular to said first direction, said method comprising the steps of:
   selectively providing a film which covers at least said first and second scribe regions and has a hardness greater than a hardness of said semiconductor wafer;
   selectively etching said film along longitudinal center lines of said first and second scribe regions by a lithographic process using a resist, so as to form masks, each of which comprises a pair of slender stripe masks separated from each other by a gap which extends on said longitudinal center line, so that longitudinal center parts of said first and second scribe regions are shown through said gaps of said masks;
   carrying out an anisotropic etching of said longitudinal center parts of said first and second scribe regions by use of said masks to form trench grooves having a depth greater than a width of said trench grooves and which extend along said longitudinal center lines of said first and second scribe regions; and
   cleaving said semiconductor wafer along said trench grooves to pelletize said semiconductor wafer into a plurality of pellets.

12. The method as claimed in claim 11, wherein said semiconductor wafer is cleaved by the steps of:
   adhering at least an opposite face of said semiconductor wafer to another face, on which said metal mask extends, onto at least an adhesive tape; and
   applying a pressure onto said adhesive tape to apply a force to said semiconductor wafer to cause cleaving said semiconductor wafer along said trench grooves.

13. The method as claimed in claim 12, wherein said pressure is selectively applied to be concentrated onto said first and second scribe regions.

14. The method as claimed in claim 13, wherein said pressure is applied by pressing a cylindrically shaped roller to said semiconductor wafer and rolling said cylindrically shaped roller along said first and second directions.

15. The method as claimed in claim 11, wherein said film comprises laminations of Ti/Al layers.

16. The method as claimed in claim 11, wherein said semiconductor wafer is a compound semiconductor wafer having a lower hardness than a silicon semiconductor wafer.

17. The method as claimed in claim 11, wherein said film is a metal film formed to cover said first and second scribe regions and a pellet region before said metal film is selectively etched to form not only said mask over said first and second scribe regions, but also a metal pattern for a device over said pellet region.

18. A method of forming a groove on a wafer for allowing said wafer to be cleaved along said groove for dividing said wafer into a plurality of pellets, said method comprising the step of:

carrying out an anisotropic etching by use of a mask covering at least a part of a pellet-dividing region of said wafer, wherein said mask has a hardness greater than a hardness of said wafer and a gap extending in a longitudinal direction of said pellet-dividing region, so as to selectively etch a longitudinally extending part of said pellet-dividing region shown through said gap of said mask to form a groove in said pellet-dividing region having a death greater than a width of said groove.

19. The method as claimed in claim 18, wherein said mask is made of a metal and said anisotropic etching step comprises a dry-etching process.

20. The method as claimed in claim 18, wherein said mask comprises a pair of slender stripe masks separated from each other by said gap which extends on a longitudinal center line of said pellet-dividing region.

21. The method as claimed in claim 18, wherein said pellet-dividing region comprises first pellet-dividing regions which extend in parallel to each other over said semiconductor wafer in a first direction parallel to an orientation flat of said semiconductor wafer and second pellet-dividing regions which extend in parallel to each other over said semiconductor wafer in a second direction perpendicular to said first direction.

22. The method as claimed in claim 18, wherein said mask comprises laminations of Ti/Al layers.

23. The method as claimed in claim 18, wherein said wafer is a compound semiconductor wafer.

24. The method as claimed in claim 18, wherein said wafer is a silicon wafer.

25. The method as claimed in claim 18, wherein said wafer is a ceramic wafer.

\* \* \* \* \*